(12) United States Patent
Loomis

(10) Patent No.: US 7,682,933 B1
(45) Date of Patent: Mar. 23, 2010

(54) WAFER ALIGNMENT AND BONDING

(75) Inventor: Andrew H. Loomis, Westford, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 93 days.

(21) Appl. No.: 11/973,981

(22) Filed: Sep. 26, 2007

(51) Int. Cl.
 H01L 21/76 (2006.01)
 H01L 21/30 (2006.01)
 H01L 21/46 (2006.01)

(52) U.S. Cl. .................. 438/457; 438/455; 438/401; 257/E21.122

(58) Field of Classification Search .......... 438/455, 438/457; 257/E21.122
 See application file for complete search history.

(56) References Cited

U.S. PATENT DOCUMENTS

| 5,236,118 A * | 8/1993 | Bower et al. ............... 228/193 |
| 5,780,311 A * | 7/1998 | Beasom et al. .............. 438/406 |
| 7,479,441 B2 * | 1/2009 | Kirk et al. .................... 438/455 |
| 2006/0081062 A1 * | 4/2006 | Silverbrook et al. .......... 73/754 |
| 2006/0286710 A1 * | 12/2006 | Sugita et al. ................ 438/106 |

* cited by examiner

Primary Examiner—Alexander G Ghyka
Assistant Examiner—Seahvosh J Nikmanesh
(74) Attorney, Agent, or Firm—AFMCLO/JAZ; Thomas C. Stover

(57) ABSTRACT

Provided is a method and apparatus for close alignment of two or more electrically conductive wafers which are positioned face-to-face in closely spaced opposition, the wafers having position marks on corresponding portions thereof, the wafers being aligned as to their mating components, as guided by optically comparing the alignment of the respective position marks; deflecting an interior portion of one of the wafers into contact with the other wafer, to partially bond the wafers to each other, then fully contacting and bonding the rest of the wafer pair and then optically checking the resulting wafer alignment to see if same is acceptable.

14 Claims, 5 Drawing Sheets

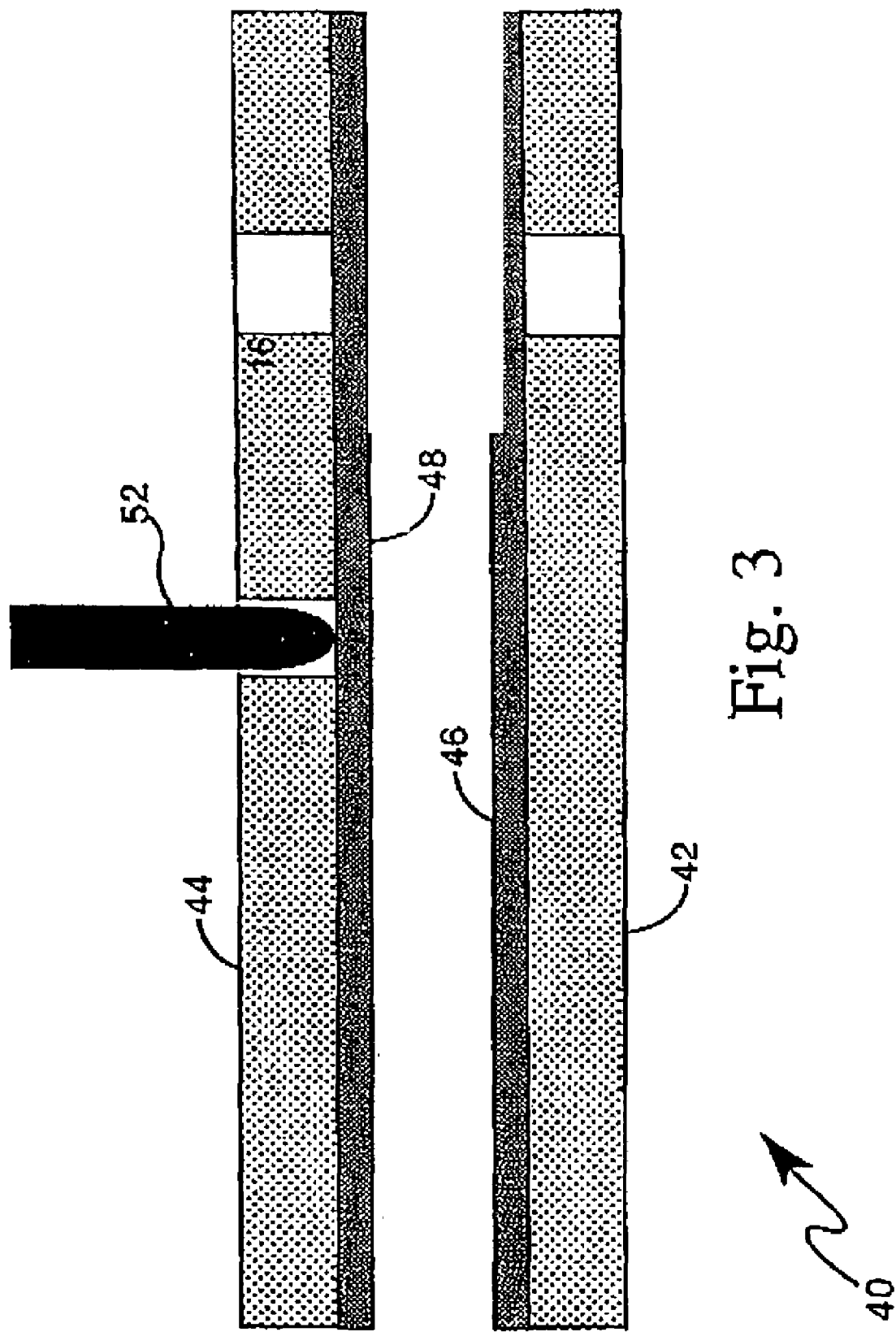

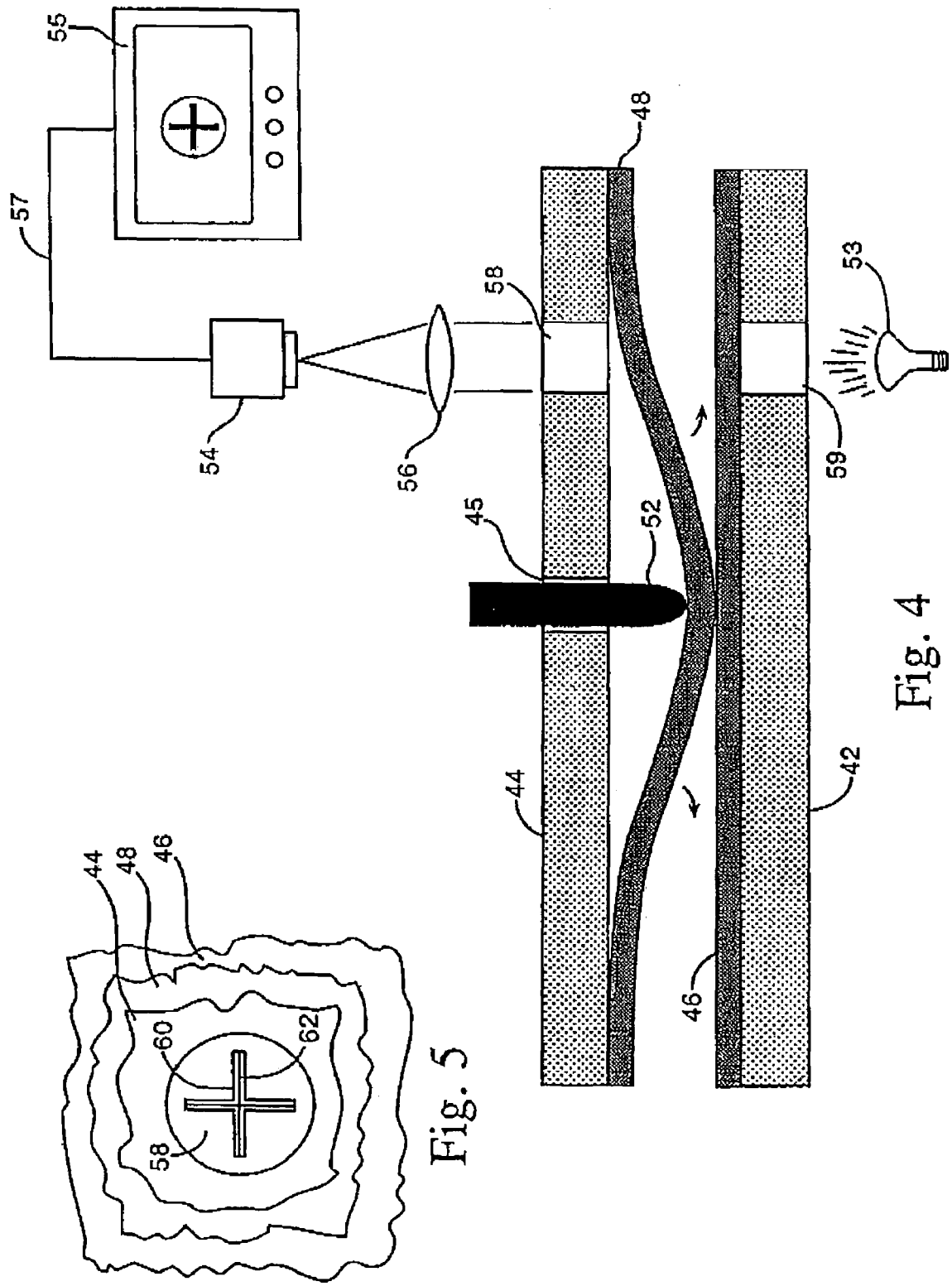

WAFER ALIGNMENT AND BONDING

STATEMENT OF GOVERNMENT INTEREST

The invention described herein may be manufactured and used by or for the Government for governmental purposes without the payment of any royalty thereon.

RELATED APPLICATIONS

None

FIELD OF THE INVENTION

This invention relates to wafer alignment and bonding, particularly accurate alignment thereof.

BACKGROUND OF THE INVENTION

Microsystem technology applications are often composed of two or more patterned substrates that are aligned and then bonded to each other. Wafer-to-wafer or two-substrate bonding is used to form micromechanical structures in such applications.

Thus the wafers are aligned in an alignment tool using either image capture, visible or IR alignment methods. Once aligned, the wafers are held in place by a removable clamping fixture that has two more clamps that clamp the edges of the wafers to spacer members to hold the wafers a desired distance apart. That is, the spacers keep the wafers face-to-face but separated by a few microns.

After the wafers are aligned, they are locked in a clamping fixture and moved to a separate bonding machine. Once in the bonding machine, a center or interior point contact is made to hold the wafers together at least at the contact point. The clamps are then removed and the spacer retracted and bonding of the wafer pair begins. However, there are drawbacks in the above prior art method. That is, the applying of the clamping fixture invariably allows some movement when clamping force is applied. Also, particles often result from the withdrawal of the mechanical spacers, a chronic problem.

Also, during transfer to a bonding chamber, the clamping fixture is subject to mechanical transfer forces and temperature variations which can affect the wafer alignment.

Then, in the bonding chamber, a vacuum is usually applied which causes turbulence and can add more particles between wafers before they are sealed together.

Accordingly there is need and market for method & apparatus for preserving wafer alignment from the alignment stage to the bonding stage of such wafers while avoiding or minimizing the chance for particles to become embedded between wafers before the bonding step is complete.

There has now been discovered method and apparatus for preserving wafer alignment and bonding of such wafers while minimizing particle intrusion therebetween, as further described below.

SUMMARY OF THE INVENTION

Broadly, the present invention provides a method for alignment of a stack of two or more electrically conductive wafers comprising, placing the wafers in closely spaced face-to-face opposition, which faces have been hydrophilically treated and deflecting one wafer into contact with the other at an interior portion thereof, while holding the remainders of the wafers apart, by exterior pulling means, to partially bond the wafer pair.

Also provided is the step of releasing the above wafers so as to permit a contact bonding wave to spread from such interior portion to the wafer edges to adhere the wafers to each other in a full bond.

Also per the invention, contact between the spaced wafers can be initiated at opposed, spaced wafer edges causing a contact bonding wave to spread between the wafers to join the remaining portions thereof. However the above initial interior bonding contact method is preferred.

Further provided is the method of providing position marks on corresponding portions of the two wafers and optically checking the alignment of the marks before and after full bonding of the wafer pair.

Also provided is a 3D bonded microsystem structure of a stack of two or more patterned wafers aligned to within <1 micron or 1µ.

Definitions:

By wafer alignment, as used herein, is meant alignment of the mating components in a stack of two or more wafers.

BRIEF DESCRIPTION OF THE DRAWINGS

The Invention will become more apparent from the following detailed specification and drawings in which;

FIG. 3 is an elevation schematic view of a wafer alignment and bonding apparatus according to the present invention;

FIG. 4 is an elevation schematic view of the apparatus of FIG. 3, with added components, in operation;

FIG. 5 is a fragmentary schematic plan view of an alignment guide system employed by the apparatus of FIG. 4;

DESCRIPTION OF PREFERRED EMBODIMENTS

Referring in more detail to the drawings, in the prior art, wafer-to-wafer patterned substrates are first aligned and later bonded to each other. Such systems use a mechanical clamping fixture which holds the alignment of wafers at, e.g., 3 points on the wafers' perimeter. Thus two wafers 18 & 20, are aligned and spaced apart by spacers 20 & 22, in the clamps 24 & 26, as shown in FIG. 1.

Figure 2:
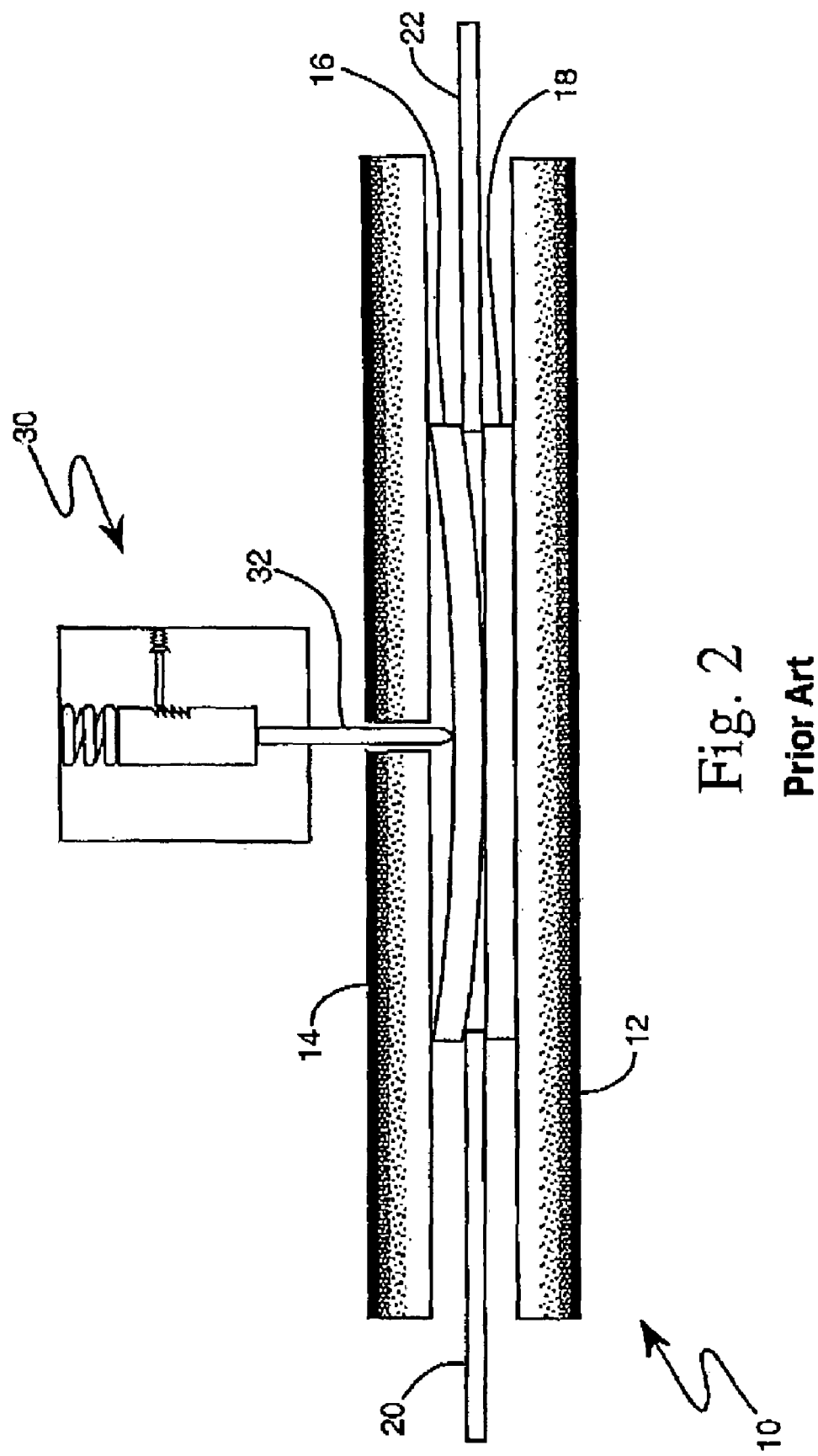
FIG. 2 is an elevation schematic view of the apparatus of FIG. 1 in a bonding machine.

Then the so aligned wafers are transported, in the prior art, from an alignment stage to a bonding stage, such as bonding apparatus 10, shown in FIG. 2.

Figure 1:
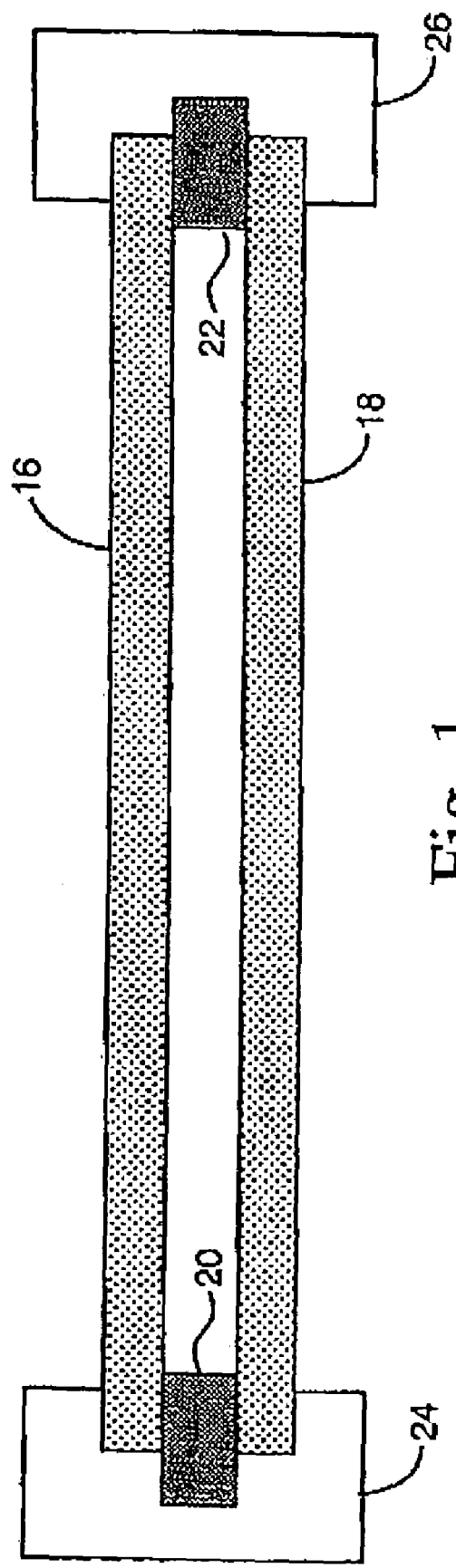
FIG. 1 is an elevation schematic view of a prior art wafer alignment apparatus.

Here, the so clamped and aligned wafer pair are placed in the bonding apparatus 10, between a pair of spaced chucks 12 & 14, as indicated in FIG. 2, except that the plunger 32 is retracted and wafer 16 is still spaced from wafer 18, per FIG. 1 and such wafer 16 is yet undeflected and in close proximity or in contact with chuck 14 of bonding apparatus 10, as indicated in FIGS. 1 & 2. Subsequently, the plunger 32 descends, contacting the wafer 16 and deflecting an interior portion thereof toward and into contact with wafer 18 below, as shown or indicated in FIG. 2. Upon such contact, a bonding wave spreads radially outwardly from the contact point between the two wafers and, at about the same time, the clamped spacers 20 and 22 are withdrawn from between such wafers, which allows the contact wave to propagate to the wafers' edge. Heat and pressure are then applied to create a strong and permanent bond between the two wafers 16 & 18.

However, misaligned wafers and entrained particles therebetween can result with the above two-stage prior art method, as discussed above and as indicated in FIG. 6.

Figure 6:
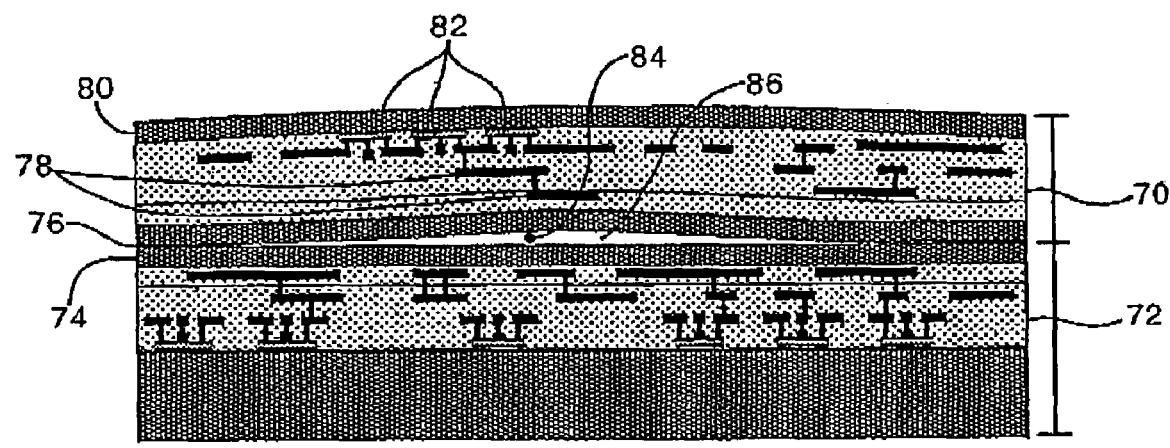
FIG. 6 is an elevation schematic view of bonded layers as prepared by the prior art apparatus of FIG. 2

That is, two wafers 70 & 72, with circuitry therein, have been bonded together at layers 74 and 76 but with at least one particle 84 captured therebetween, which creates a void 86 between such layers, resulting in incomplete bonding therebetween and deformation of such layers, resulting in a faulty bonded structure 66, with impaired conductivity and performance, as shown or indicated in FIG. 6.

A new procedure and improved apparatus is required to overcome the above prior art shortcomings. The present invention provides a way out of the above difficulty, as shown or indicated in FIGS. 3 and 4.

Thus, wafers 46 & 48 are held in vacuum contact with chucks 42 and 44 while maintaining e.g., a 5-10 micron (µ) separation. No physical spacers are needed for separating the two wafers, thus eliminating potential particle incursions.

The wafers are then precision aligned, to less than 1µ offset, using visible and/or IR illumination. That is, as shown or indicated in FIGS. 4 & 5, viewing apertures 58 & 59 are provided in the respective vacuum chucks 44 & 42, for IR alignment, lamp 53 is mounted under aperture 59 and IR light detector 54, in combination with focusing lens 56, being mounted above aperture 58, as shown in FIG. 4. The IR light detector is electrically connected to light monitor 55 to display the light received from IR lamp 53.

To complete the alignment system, the upper wafer 48 is marked with crosshairs 60 while the lower wafer 46 is marked with crosshairs 62, as indicated in FIG. 5, such crosshairs being in at least partial alignment with the viewing apertures 58 and 59, which crosshairs are illuminated by IR lamp 53 and protected upwardly to lens 56 (or just to the eye of the observer, not shown), through IR receptor 54 and thence to monitor 55 (via conductor 57), which displays the relative position of the crosshairs 60 & 62, on the monitor 55, as shown or indicated in FIG. 4. Thus the respective wafers 46 and 48 can be readily positioned in accurate alignment when the crosshairs 60 & 62 line up, as shown or indicated in FIGS. 4 & 5, before the plunger 52 is activated to deform or press wafer 48 toward wafer 46. That is, the alignment of the crosshairs 60 & 62 can be viewed at the monitor 55, at no magnification or various magnifications, such as low magnification, 50-500× or high magnification 500-1000×, to achieve highly precise alignment of the wafers 46 & 48, as indicated in FIGS. 4 & 5. Once satisfactory alignment is achieved, the plunger 52 can descend, through aperture 45, in chuck 44, pushing an inner portion of wafer 48 toward wafer 46 and into contact therewith in a central or interior portion of each wafer. That is, at this point in which interior contact between two wafers is made, separation of the rest of the wafer pair is maintained by the vacuums applied by vacuum chucks 44 & 42, as indicated in FIG. 4. Thus, the wafer pair are now bonded at an interior area with no shift in wafer alignment to contend with. To this end the plunger 52 can be round in cross-section, including circular, oval or other round shape or a combination thereof, as can its aperture 45 per FIG. 4 hereof.

The next step is to complete the bonding of the wafer pair. That is, the vacuum holding the rest or peripheral portions of wafer 48 separate from the rest of the wafer 46, can be suitably reduced to permit a bonding wave to spread radially outwardly from the bonded interior portion of the pair to the wafers' edges to achieve full (or peelable) bonding of the wafer pair.

The alignment of the above wafer pair can then be verified by the above IR optical system. Thereafter heat and/or pressure can be applied to the so bonded wafer pair either in situ (or after transfer to a bonding apparatus or bonder), to create a stronger more permanent bond, with continuing precise alignment of the wafer pair, while avoiding voids and/or trapped particles between the so bonded wafers.

Figure 7:
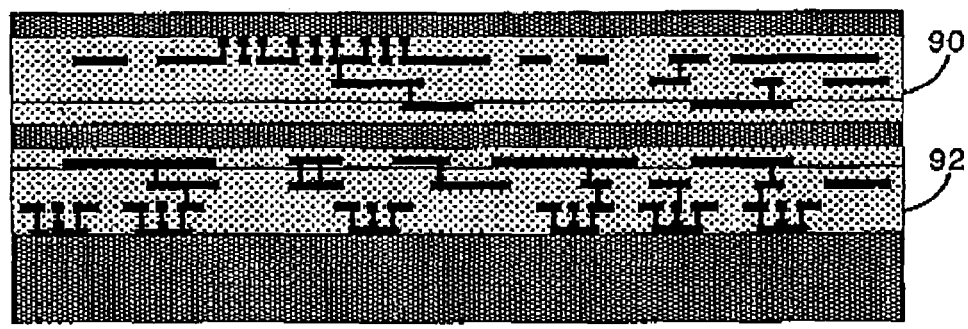
FIG. 7 is an elevation schematic view of bonded layers embodying the invention prepared by the alignment and bonding methods of the invention.

The inventive product provided according to the method and apparatus of the invention, is shown as 3D bonded microsystem structure 68 in FIG. 7, wherein the respective wafer layers 90 & 92 are precisely bonded in close contact with little or no intrusive particles or voids disrupting the continuity of contact therebetween, permitting excellent electrical properties of the so bonded and aligned structure made possible by the present Invention.

Recall that in prior art systems, e.g., per FIGS. 1 & 2, there is much uncertainty of the alignment integrity in the transport of a wafer pair from an alignment fixture to a bonder, due to the actual separation of the wafers by spacers 20 and 22 of the prior art. Only after the bonded wafer pair is removed from the bonder can one check the alignment between the so bonded pair. Typically, there is a shift between prior alignment and final bond of the wafer pair. However, the inventive method and apparatus greatly reduces the potential for such alignment shift, as indicated above.

Accordingly, the method and apparatus of the present invention provides safeguards against misaligned bonded wafers, incursions of particles and voids between wafers, to provide precise wafer structures with properly aligned circuitry and high electrical conductivity and also can greatly lower the reject rate of malformed wafer stacks.

With vacuum chucks per the invention, the wafer pair can be separated by minimum distance of <5-10µ, with the vacuum chucks preferably specified flat to within ±1 micron. With such close proximity of the wafer pairs, the depth of focus for the optical objectives will be minimized in order to obtain under (<) 1µ alignment accuracy in high-power optical viewing of the wafer alignment crosshairs or other alignment marks.

The vacuum chucks that hold the wafers are attached to electrically controlled precision motor stages that use piezoelectric motor interferometers or other means, to position the movement of the stages to within less than (<) 1µ alignment accuracy. This technology is readily available in the semiconductor industry and is used in wafer steppers for the exposure of photoresist patterns on wafers.

The above process is dependent upon the wafers to be aligned, having hydrophilic surfaces that have been chemically pretreated e.g., with hot hydrogen peroxide, sulfuric acid or an rca clean typically used in semiconductor processes.

That is, two wafers with hydrophilic surfaces are attracted to each other and can form a reasonable room temperature bond (i.e., a peelable bond) of sufficient strength so as to maintain prior alignment while the wafer pair is transferred to a bonder for heat treatment and further bond strengthening, as desired.

It should be noted that if the wafer pair are brought into initial contact and a contact wave spreads to bond the wafer pair at ambient temperature the wafers will now be bonded with no shift in alignment, as confirmed by the IR optical system described above. If however, the wafer pair does bond out of alignment, as determined by the above IR optical tests, the wafers can yet be peeled apart released and the above alignment and bonding process repeated, the alignment of the realigned and re-bonded pair confirmed optically and then the now accurately bonded pair can be bonded in situ or transferred to a bonder with heat and/or pressure applied thereto for a more permanently bonded wafer structure.

Also as indicated previously, more than two wafer layers can be stacked, aligned and bonded in the manner described above to form a bonded multi-wafer structure, as desired, per the invention.

What is claimed is:

1. A method for alignment of at least two wafers comprising,
    a) placing said wafers in closely spaced face-to-face opposition, which faces have been hydrophilically treated,
    b) deflecting one wafer into contact with the other at least at an interior portion thereof, while holding the remainders of said wafers apart, by exterior pulling means, to partially bond the wafer pair and
    c) releasing said remainders so as to permit a contact bonding wave to spread from said interior portion to the wafer edges to adhere said wafers to each other in a full bond.

2. The method of claim 1 comprising, providing position marks on corresponding portions of the two wafers and optically checking the alignment of said marks before and after full bonding of said wafer pair.

3. The method of claim 2 comprising, applying heat and/or pressure in situ to more permanently bond the wafer pair.

4. The method of claim 2 wherein said wafers are placed on a pair of opposed vacuum pulling chucks, said chucks each having a viewing aperture therein in optical alignment with each other and in view said position marks so that a viewer can adjust the position of one or both wafers as desired, to achieve alignment of said marks and thus alignment of the wafers before partially bonding said wafer pair.

5. The method of claim 4 wherein said position marks in said aligned viewing apertures are illuminated by IR light for read-out by a detector which feeds a visual display.

6. The method of claim 5 serving to align two or more wafers to within <1μ.

7. The method of claim 4 wherein said position marks are in the form of cross-hairs on each wafer, which cross-hairs are visually distinct even when overlapped.

8. The method of claim 7 wherein said wafers can be separated by a minimum distance of <5-10μ with said chucks specified flat to within ±1μ.

9. The method of claim 2 serving to align two or more wafers to within 1μ.

10. The method of claim 1 comprising,
    a) transferring the contact bonded wafer pair to a bonding apparatus and
    b) applying heat and/or pressure to more permanently bond the wafer pair.

11. The method of claim 10 serving to align two or more wafers to within <1μ.

12. The method of claim 1 wherein said exterior pulling means is at least two vacuum sources exterior to said wafer pair.

13. The method of claim 1 wherein said wafers are placed on a pair of opposed vacuum pulling chucks and said one wafer is deflected by a plunger that passes through an aperture in one of said chucks.

14. The method of claim 1 wherein, if desired, said wafers can be peeled apart and cleaned for realignment and rebonding.

* * * * *